(12) United States Patent
Cheng et al.

(10) Patent No.: US 11,521,938 B2
(45) Date of Patent: Dec. 6, 2022

(54) CHIP PACKAGE INCLUDING SUBSTRATE INCLINED SIDEWALL AND REDISTRIBUTION LINE

(71) Applicant: XINTEC INC., Taoyuan (TW)

(72) Inventors: Chia-Ming Cheng, New Taipei (TW); Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/140,964

(22) Filed: Jan. 4, 2021

(65) Prior Publication Data

US 2021/0210436 A1    Jul. 8, 2021

Related U.S. Application Data

(60) Provisional application No. 62/957,600, filed on Jan. 6, 2020.

(51) Int. Cl.
| | | |
|---|---|---|
| *H01L 23/552* | (2006.01) | |
| *H01L 23/528* | (2006.01) | |
| *H01L 23/66* | (2006.01) | |
| *H01L 21/56* | (2006.01) | |
| *H01L 23/31* | (2006.01) | |
| *H01L 23/522* | (2006.01) | |

(52) U.S. Cl.
CPC .......... *H01L 23/552* (2013.01); *H01L 21/565* (2013.01); *H01L 23/3135* (2013.01); *H01L 23/5226* (2013.01); *H01L 23/5286* (2013.01); *H01L 23/66* (2013.01); *H01L 2223/6605* (2013.01); *H01L 2223/6677* (2013.01)

(58) Field of Classification Search
CPC . H01L 23/552; H01L 21/565; H01L 23/3135; H01L 23/5226; H01L 23/5286; H01L 23/66; H01L 2223/6605; H01L 2223/6677
USPC .......................................................... 257/659
See application file for complete search history.

(56) References Cited

U.S. PATENT DOCUMENTS

| | | | |
|---|---|---|---|
| 2010/0078795 A1 | 4/2010 | Dekker et al. | |
| 2017/0186797 A1* | 6/2017 | Long | ................. H01L 27/14636 |
| 2017/0301986 A1 | 10/2017 | Nguyen et al. | |
| 2019/0043794 A1 | 2/2019 | Kapusta et al. | |
| 2020/0203851 A1 | 6/2020 | Takaki et al. | |

FOREIGN PATENT DOCUMENTS

| | | |
|---|---|---|
| CN | 101213665 | 7/2008 |
| CN | 110679039 | 1/2020 |
| EP | 3664221 | 10/2020 |

(Continued)

*Primary Examiner* — Didarul A Mazumder
(74) *Attorney, Agent, or Firm* — Liu & Liu

(57) ABSTRACT

A chip package includes a first substrate, a second substrate, a first conductive layer, and a metal layer. The first substrate has a bottom surface and an inclined sidewall adjoining the bottom surface, and an obtuse angle is between the bottom surface and the inclined sidewall. The second substrate is over the first substrate and has a portion that laterally extends beyond the inclined sidewall of the first substrate. The first conductive layer is between the first substrate and the second substrate. The metal layer is on said portion of the second substrate, on the bottom surface and the inclined sidewall of the first substrate, and electrically connected to an end of the first conductive layer.

13 Claims, 13 Drawing Sheets

(56) References Cited

FOREIGN PATENT DOCUMENTS

| | | |
|---|---|---|
| JP | 2001-527700 | 12/2001 |
| JP | 2009-500821 | 1/2009 |
| JP | 2009-283944 | 12/2009 |
| JP | 2010-098274 | 4/2010 |
| JP | 2012-222366 | 11/2012 |
| TW | 201918138 | 5/2019 |
| WO | 2007/004137 | 1/2007 |
| WO | 2019/026913 | 2/2019 |

* cited by examiner

CHIP PACKAGE INCLUDING SUBSTRATE INCLINED SIDEWALL AND REDISTRIBUTION LINE

RELATED APPLICATION

This application claims priority to U.S. Provisional Application Ser. No. 62/957,600, filed Jan. 6, 2020, which is herein incorporated by reference in its entirety.

BACKGROUND

Field of Invention

The present invention relates to a chip package.

Description of Related Art

In some kinds of chip packages, preventing electromagnetic interference (EMI) is very important. For example, chip packages including microelectromechanical systems (MEMS), CMOS Image sensors (CIS), and antennas would be affected by electromagnetic interference during operation. In a typical chip package, a metal can structure may be additionally disposed on the substrate of the chip package. The metal can structure protects the sensing structure of the chip package below the metal can structure from electromagnetic interference.

However, the metal can structure has footprints on the substrate of the chip package, and a gap is formed between the metal can structure and the top of the chip package. As a result, chip miniaturization is difficult to be achieved.

SUMMARY

An aspect of the present disclosure is to provide a chip package.

According to some embodiments of the present disclosure, a chip package includes a first substrate, a second substrate, a first conductive layer, and a metal layer. The first substrate has a bottom surface and an inclined sidewall adjoining the bottom surface, and an obtuse angle is between the bottom surface and the inclined sidewall. The second substrate is over the first substrate and has a portion that laterally extends beyond the inclined sidewall of the first substrate. The first conductive layer is between the first substrate and the second substrate. The metal layer is on said portion of the second substrate, on the bottom surface and the inclined sidewall of the first substrate, and electrically connected to an end of the first conductive layer.

In some embodiments of the present disclosure, the metal layer includes a ground region and a redistribution line electrically isolated from the ground region.

In some embodiments of the present disclosure, said end of the first conductive layer is in contact with the ground region of the metal layer, and the first conductive layer is spaced apart from the redistribution line of the metal layer.

In some embodiments of the present disclosure, a top surface of the first substrate has a functional layer and a conductive pad in the functional layer, and the conductive pad has a sidewall in contact with the redistribution line of the metal layer.

In some embodiments of the present disclosure, the conductive pad is spaced apart from the ground region of the metal layer.

In some embodiments of the present disclosure, the functional layer laterally extends beyond the inclined sidewall of the first substrate, and the second substrate laterally extends beyond a sidewall of the functional layer.

In some embodiments of the present disclosure, the chip package further includes a first conductive structure and a second conductive structure. The first conductive structure is on a bottom surface of the ground region of the metal layer. The second conductive structure is on a bottom surface of the redistribution line of the metal layer.

In some embodiments of the present disclosure, the chip package further includes a bonding layer between the first substrate and second substrate.

In some embodiments of the present disclosure, the first substrate has a concave portion below the first conductive layer.

In some embodiments of the present disclosure, the chip package further includes a planarization layer and a passivation layer. The planarization layer is between the bottom surface of the first substrate and the metal layer, and is between the inclined sidewall of the first substrate and the metal layer. The passivation layer is below the metal layer and the planarization layer.

In some embodiments of the present disclosure, the chip package further includes a third substrate below the passivation layer and electrically connected to the metal layer.

In some embodiments of the present disclosure, the chip package further includes a second conductive layer between the bottom surface of the first substrate and the metal layer.

In some embodiments of the present disclosure, the first conductive layer is an antenna layer having a patch portion and a connection portion that is between the patch portion and the metal layer.

In some embodiments of the present disclosure, the patch portion has a greater width than the connection portion.

In the aforementioned embodiments of the present disclosure, since the metal layer is on the inclined sidewall of the first substrate, a portion of the metal layer can be electrically connected to an end of the first conductive layer. In one embodiment, said portion of the metal layer may be grounded, and thus the first conductive layer may serve as a shielding layer for electromagnetic interference (EMI). In another embodiment, the metal layer may be a redistribution line, and the first conductive layer may act as an antenna. As a result, the chip package does not need an additional metal can structure to prevent EMI, and does not need to connect an additional antenna outside the chip package. In other words, the miniaturization of the chip package containing a shielding layer or an antenna can be achieved.

An aspect of the present disclosure is to provide a chip package.

According to some embodiments of the present disclosure, a chip package includes a first substrate, a second substrate, a conductive layer, a bonding layer, and a metal layer. The first substrate has a first through hole and a first conductive pad in the first through hole. The second substrate is over the first substrate. The conductive layer is between the first substrate and the second substrate. The bonding layer is between the conductive layer and the first substrate, and the bonding layer includes conductive particles. The metal layer is in the first through hole, and is on a bottom surface of the first substrate and a sidewall of the first substrate, and is electrically connected to the conductive layer through the first conductive pad and the bonding layer.

In some embodiments of the present disclosure, the metal layer includes a ground region and a redistribution line, the ground region is electrically connected to the conductive layer, and the redistribution line is electrically isolated from the ground region.

In some embodiments of the present disclosure, the first substrate has a second through hole and a second conductive pad in the second through hole, and the redistribution line of the metal layer is electrically connected to the second conductive pad.

In some embodiments of the present disclosure, the chip package further includes a first conductive structure and a second conductive structure. The first conductive structure is on a bottom surface of the ground region of the metal layer. The second conductive structure is on a bottom surface of the redistribution line of the metal layer.

In some embodiments of the present disclosure, the first substrate has a concave portion below the conductive layer.

In some embodiments of the present disclosure, the chip package further includes a passivation layer below the metal layer.

In the aforementioned embodiments of the present disclosure, since the bonding layer including the conductive particles is between the conductive layer and the first substrate, a portion of the metal layer can be electrically connected to the conductive layer through the first conductive pad and the bonding layer. Said portion of the metal layer may be grounded, and thus the conductive layer may serve as a shielding layer for electromagnetic interference (EMI). As a result, the chip package does not need an additional metal can structure to prevent EMI. In other words, the miniaturization of the chip package containing a shielding layer can be achieved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
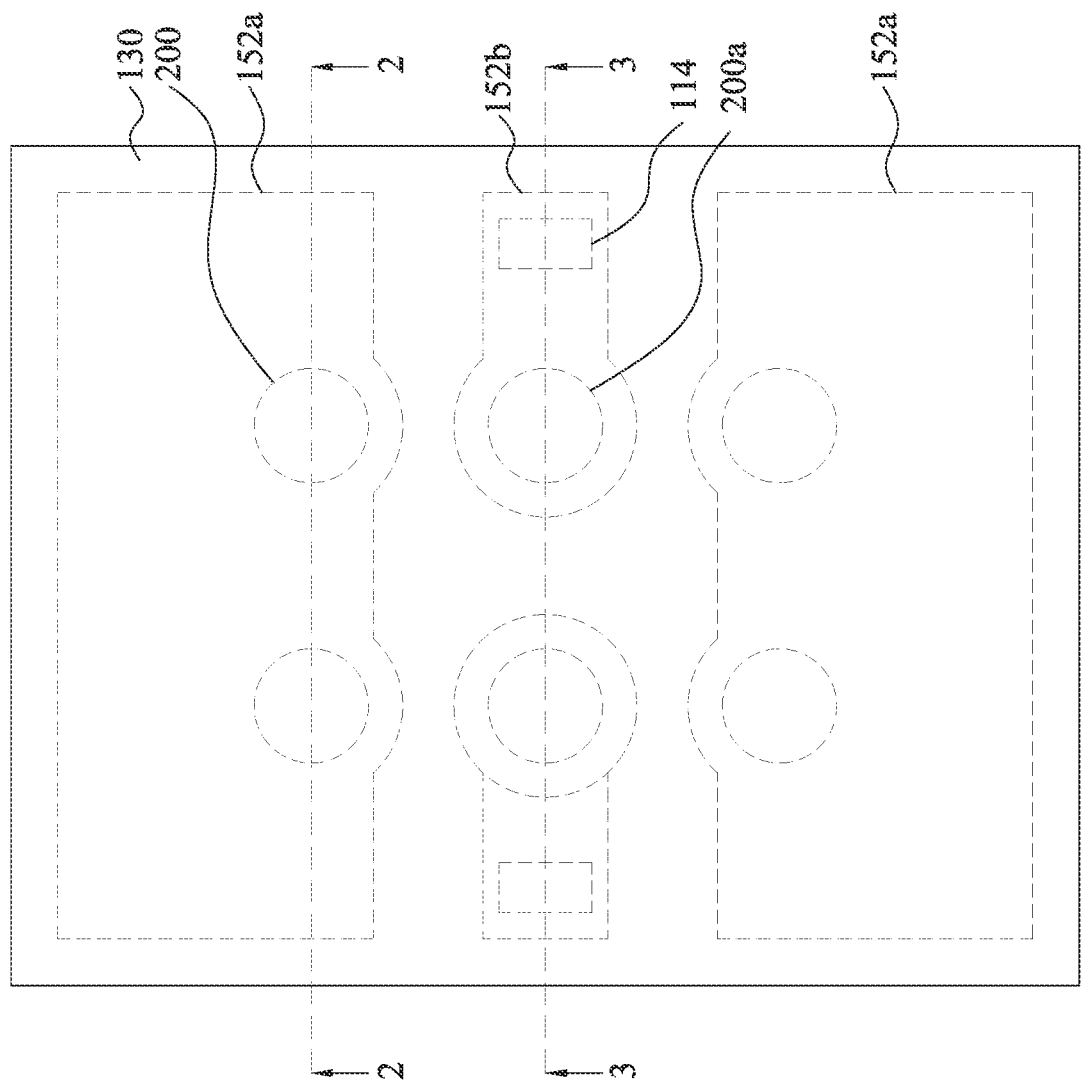
FIG. 1 is a top view of a chip package according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
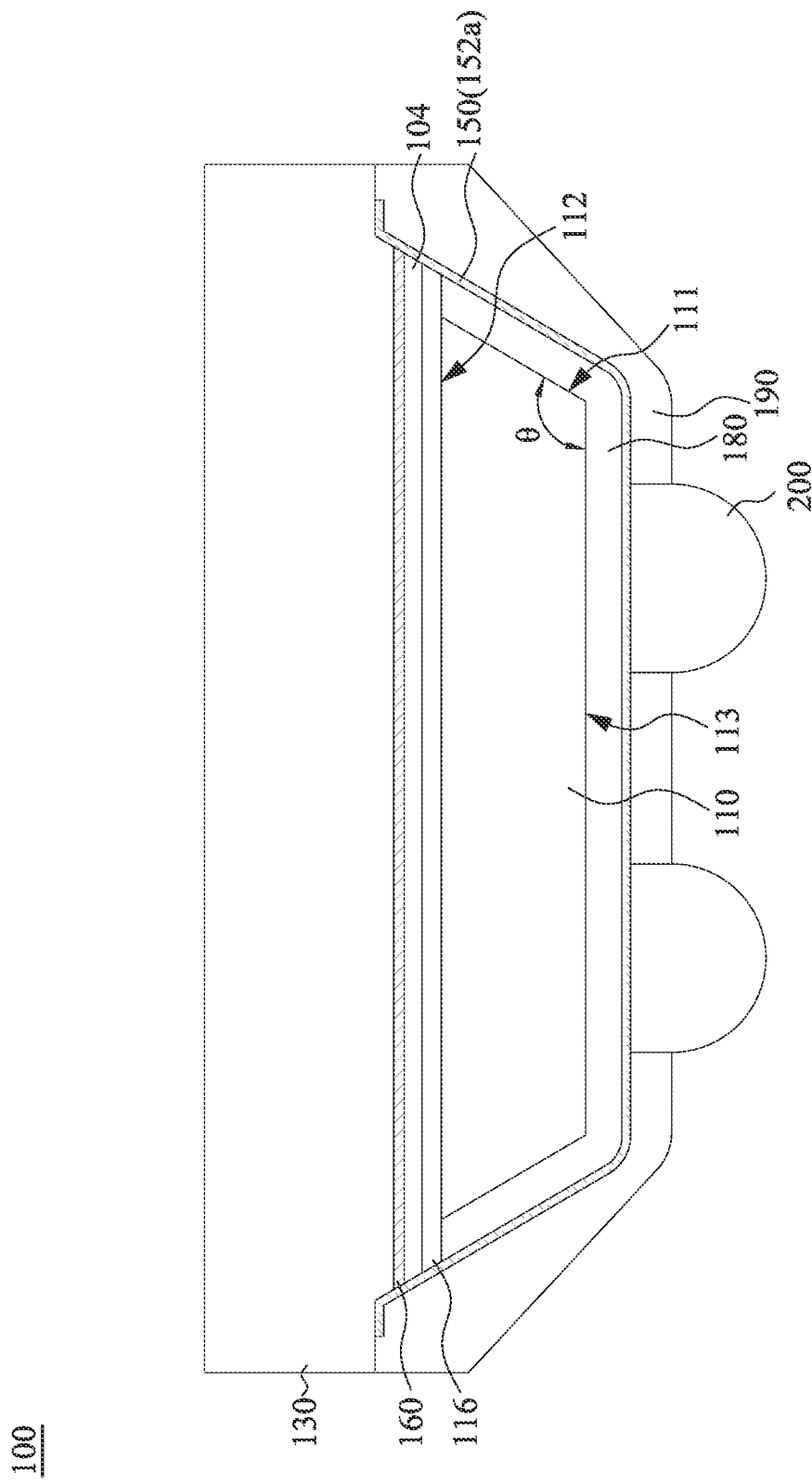
FIG. 2 is a cross-sectional view of the chip package taken along line 2-2 shown in FIG. 1.

FIG. 1 is a top view of a chip package 100 according to one embodiment of the present disclosure. FIG. 2 is a cross-sectional view of the chip package 100 taken along line 2-2 shown in FIG. 1. As shown in FIG. 1 and FIG. 2, the chip package 100 includes a first substrate 110, a second substrate 130, a first conductive layer 160, and a metal layer 150. The first substrate 110 has a bottom surface 113 and an inclined sidewall 111 adjoining the bottom surface 113, and an obtuse angle θ is between the bottom surface 113 and the inclined sidewall 111 of the first substrate 110. The second substrate 130 is over the first substrate 110 and has a portion that laterally extends beyond the inclined sidewall 111 of the first substrate 110. The first conductive layer 160 is between the first substrate 110 and the second substrate 130. The metal layer 150 is on said portion of the second substrate 130, on the bottom surface 113 and the inclined sidewall 111 of the first substrate 110, and electrically connected to an end of the first conductive layer 160. In some embodiments, the metal layer 150 and the first conductive layer 160 may be formed by performing physical vapor deposition (e.g., sputtering).

Figure 3:
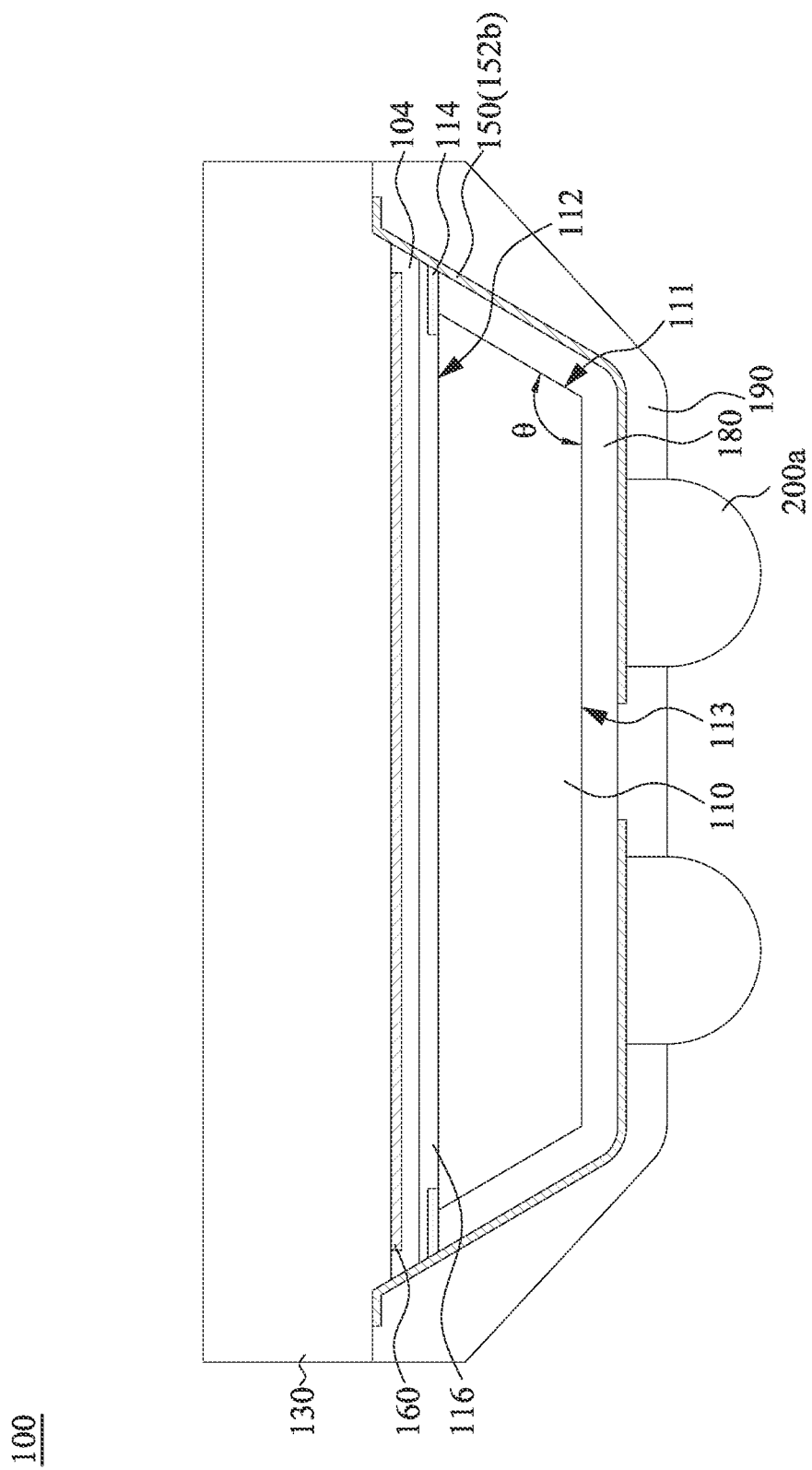
FIG. 3 is a cross-sectional view of the chip package taken along line 3-3 shown in FIG. 1.

FIG. 3 is a cross-sectional view of the chip package 100 taken along line 3-3 shown in FIG. 1. As shown in FIG. 1 to FIG. 3, the metal layer 150 includes a ground region 152*a* and a redistribution line 152*b* (RDL) electrically isolated from the ground region 152*a*. The ground region 152*a* may be a rectangular conductive pattern, but the present disclosure is not limited in this regard. Moreover, an end of the first conductive layer 160 is in contact with the ground region 152*a* of the metal layer 150 for electrical connection, while the first conductive layer 160 is spaced apart from the redistribution line 152*b* of the metal layer 150 for electrical isolation.

Since the metal layer 150 is on the inclined sidewall 111 of the first substrate 110, a portion of the metal layer 150 (i.e., the ground region 152*a*) can be electrically connected to an end of the first conductive layer 160. In some embodiments, the ground region 152*a* of the metal layer 150 can be grounded, and thus the first conductive layer 160 may serve as a shielding layer for electromagnetic interference (EMI). As a result, the chip package 100 does not need an additional metal can structure to prevent EMI. In other words, the miniaturization of the chip package 100 containing a shielding layer can be achieved.

In some embodiments, the top surface 112 of the first substrate 110 has a functional layer 116 and a conductive pad 114 that is in the functional layer 116. The conductive pad 114 has a sidewall in contact with the redistribution line 152*b* of the metal layer 150 for signal transmission. In contrast, the conductive pad 114 is spaced apart from the ground region 152*a* of the metal layer 150 for electrical isolation.

In addition, the first substrate 110 may be a semiconductor substrate made of silicon. The second substrate 130 may be a light-transmissive sheet made of glass. If the chip package 100 is used for microelectromechanical systems (MEMS), the first conductive layer 160 may be a shielding layer made of copper, and the functional layer 116 of the first substrate 110 may include a MEMS structure. The first conductive layer 160 (i.e., the shielding layer) can prevents the chip package 100 from electromagnetic interference (EMI). If the chip package 100 is used for CMOS image sensor (CIS), the first conductive layer 160 may be a shielding layer made of indium tin oxide (ITO) to let light pass through, and the functional layer 116 of the first substrate 110 may include an image sensor. Moreover, the functional layer 116 may serve as a passivation layer made of dielectric material.

Furthermore, the chip package 100 further includes a bonding layer 104 between the first substrate 110 and second substrate 130. The bonding layer 104 and the functional layer 116 laterally extend beyond the inclined sidewall 111 of the first substrate 110, and the second substrate 130 laterally extends beyond a sidewall of the bonding layer 104 and a sidewall of the functional layer 116. The sidewall of the bonding layer 104 and the sidewall of the functional layer 116 are in contact with the metal layer 150.

Moreover, the chip package further includes a first conductive structure 200, a second conductive structure 200a, a planarization layer 180, and a passivation layer 190. The first conductive structure 200 is on a bottom surface of the ground region 152a of the metal layer 150. The second conductive structure 200a is on a bottom surface of the redistribution line 152b of the metal layer 150. The first and second conductive structures 200 and 200a may be solder balls, and the present disclosure is not limited in this regard. The first and second conductive structures 200 and 200a may be electrically connected to a printed circuit board. Moreover, the planarization layer 180 is between the bottom surface 113 of the first substrate 110 and the metal layer 150, and is between the inclined sidewall 111 of the first substrate 110 and the metal layer 150. The passivation layer 190 is below the metal layer 150 and the planarization layer 180, and surrounds the first and second conductive structures 200 and 200a.

It is to be noted that the connection relationships and materials of the aforementioned elements will not be described again in the following description.

Figure 4:
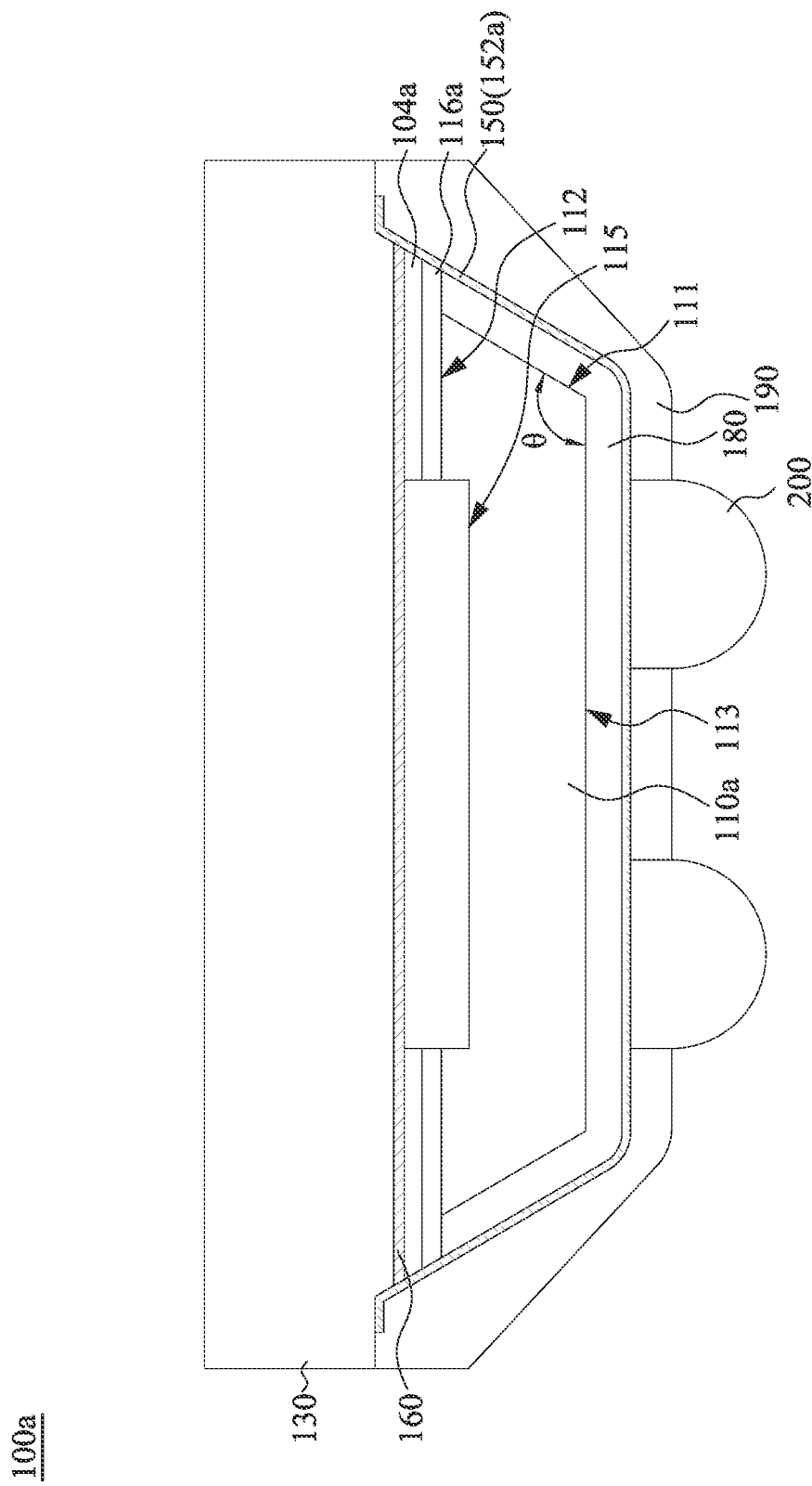
FIGS. 4 and 5 are two cross-sectional views of a chip package according to one embodiment of the present disclosure.
Figure 5:
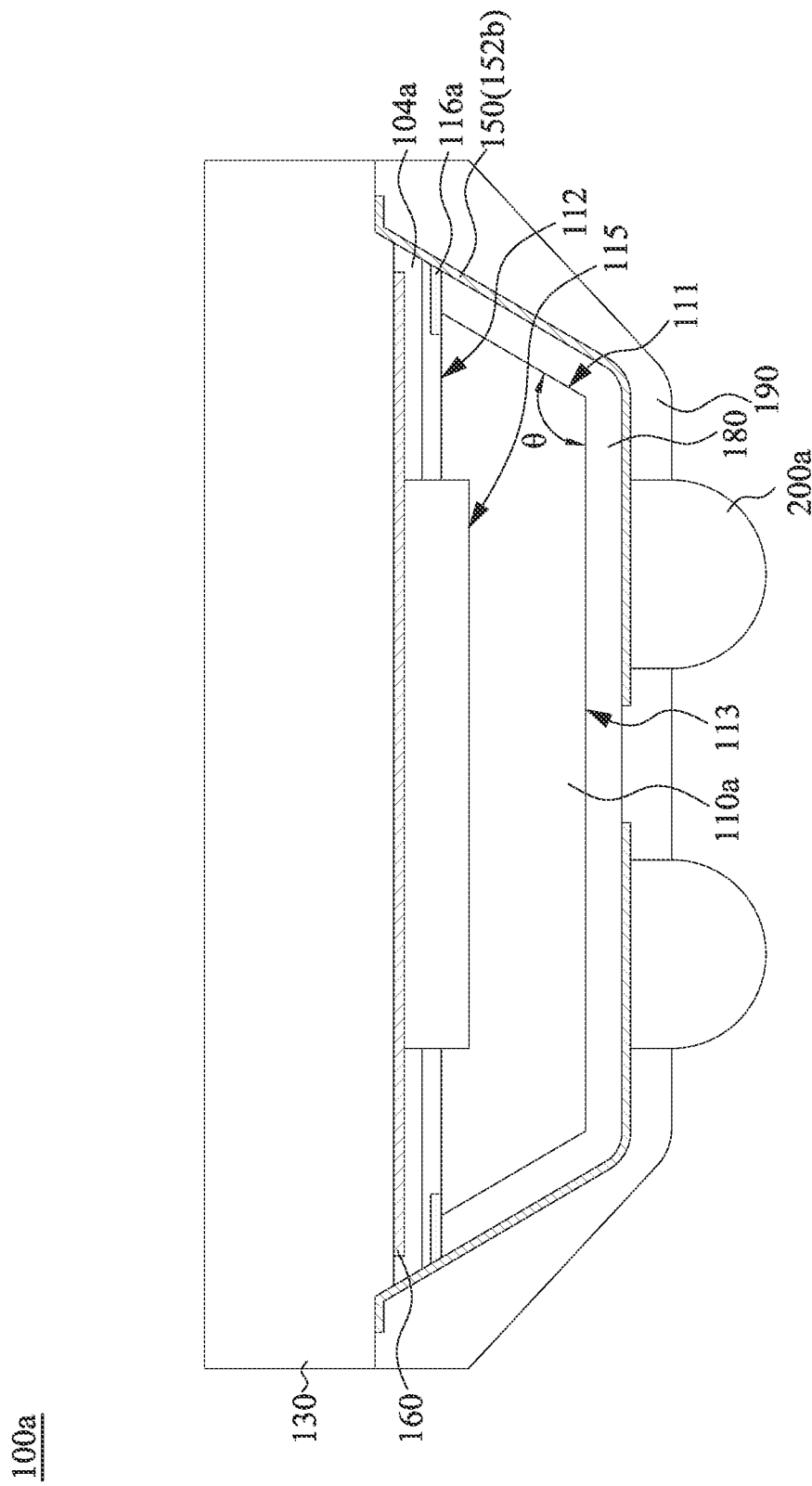

FIGS. 4 and 5 are two cross-sectional views of a chip package 100a according to one embodiment of the present disclosure. The cross-sectional position of FIG. 4 is the same as that of FIG. 2, and the cross-sectional position of FIG. 5 is the same as that of FIG. 3. As shown in FIG. 4 and FIG. 5, the chip package 100a includes a first substrate 110a, a second substrate 130, a first conductive layer 160, a metal layer 150, and a bonding layer 104a. The difference between this embodiment and the embodiment shown in FIGS. 2 and 3 is that the first substrate 110a has a concave portion 115 below the first conductive layer 160. Moreover, the first substrate 110a has a functional layer 116a thereon. The functional layer 116a and the bonding layer 104a surround the concave portion 115, such that the concave portion 115 of the first substrate 110a directly face the first conductive layer 160.

Figure 6:
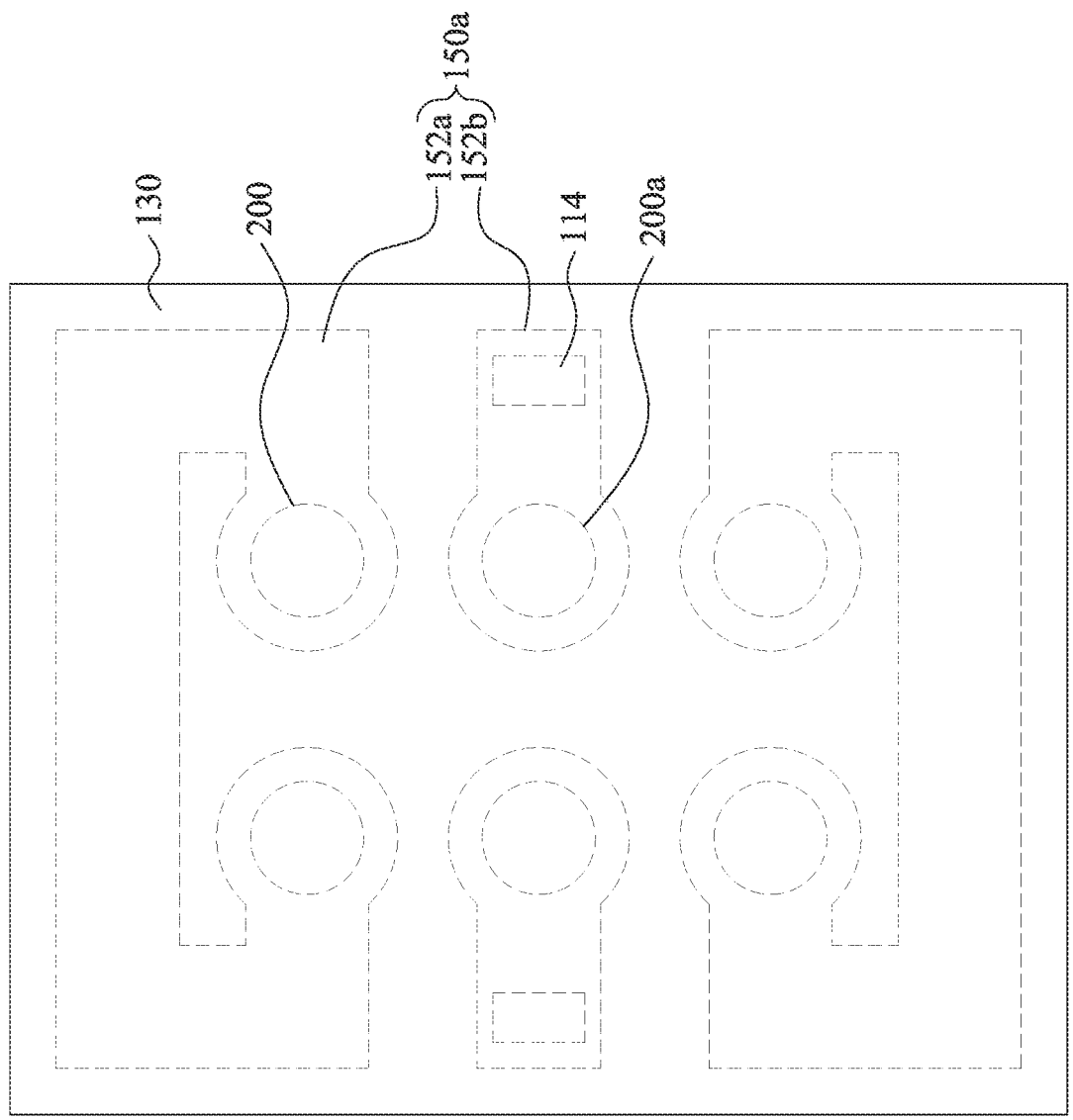
FIG. 6 is a top view of a chip package according to one embodiment of the present disclosure.

FIG. 6 is a top view of a chip package 100b according to one embodiment of the present disclosure. The chip package 100b incudes a metal layer 150a. The difference between this embodiment and the embodiment shown in FIG. 1 is that the ground region 152a of the metal layer 150a surrounds an area. The ground region 152a of the metal layer 150a may include a U-shaped conductive pattern.

Figure 7:
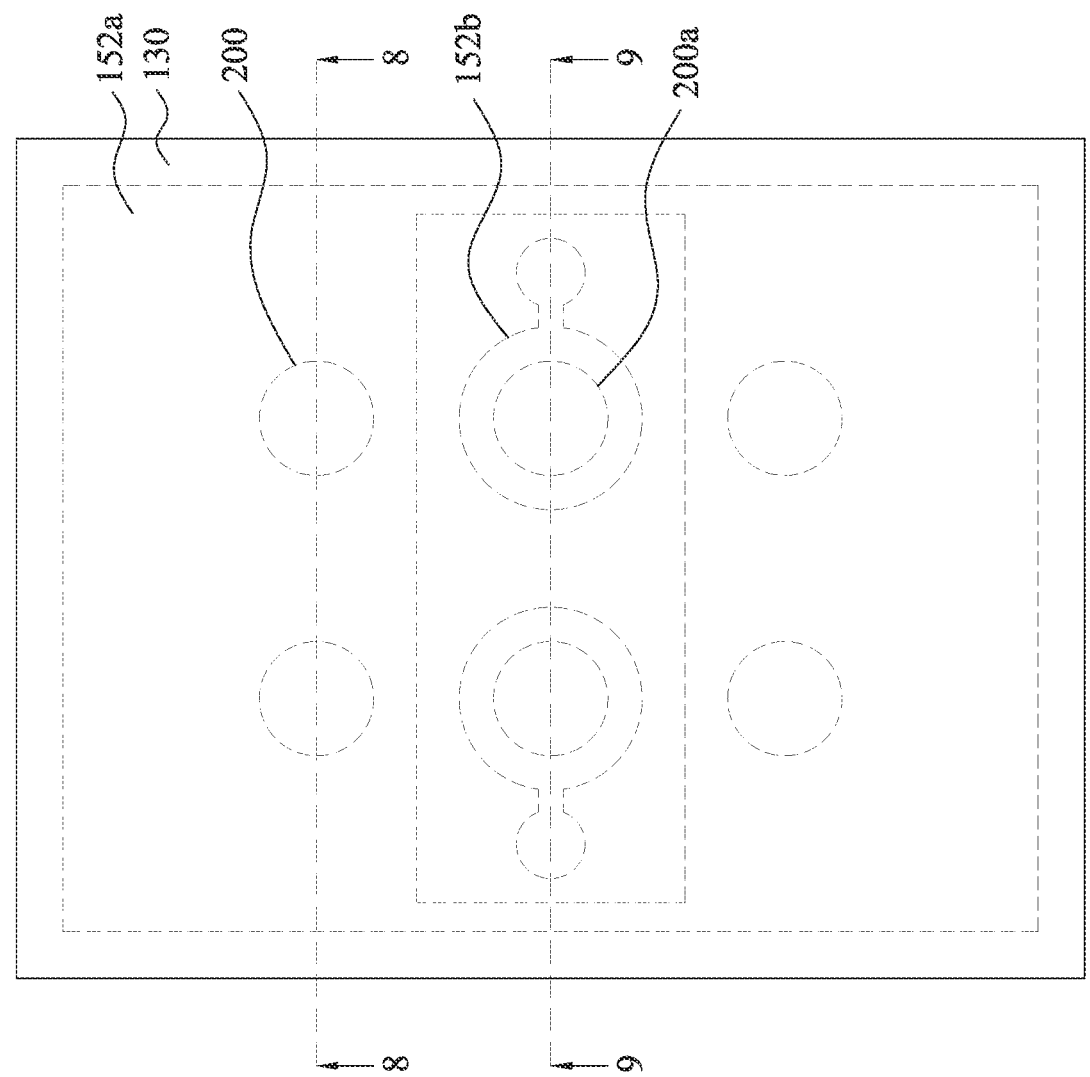
FIG. 7 is a top view of a chip package according to one embodiment of the present disclosure.
Figure 8:
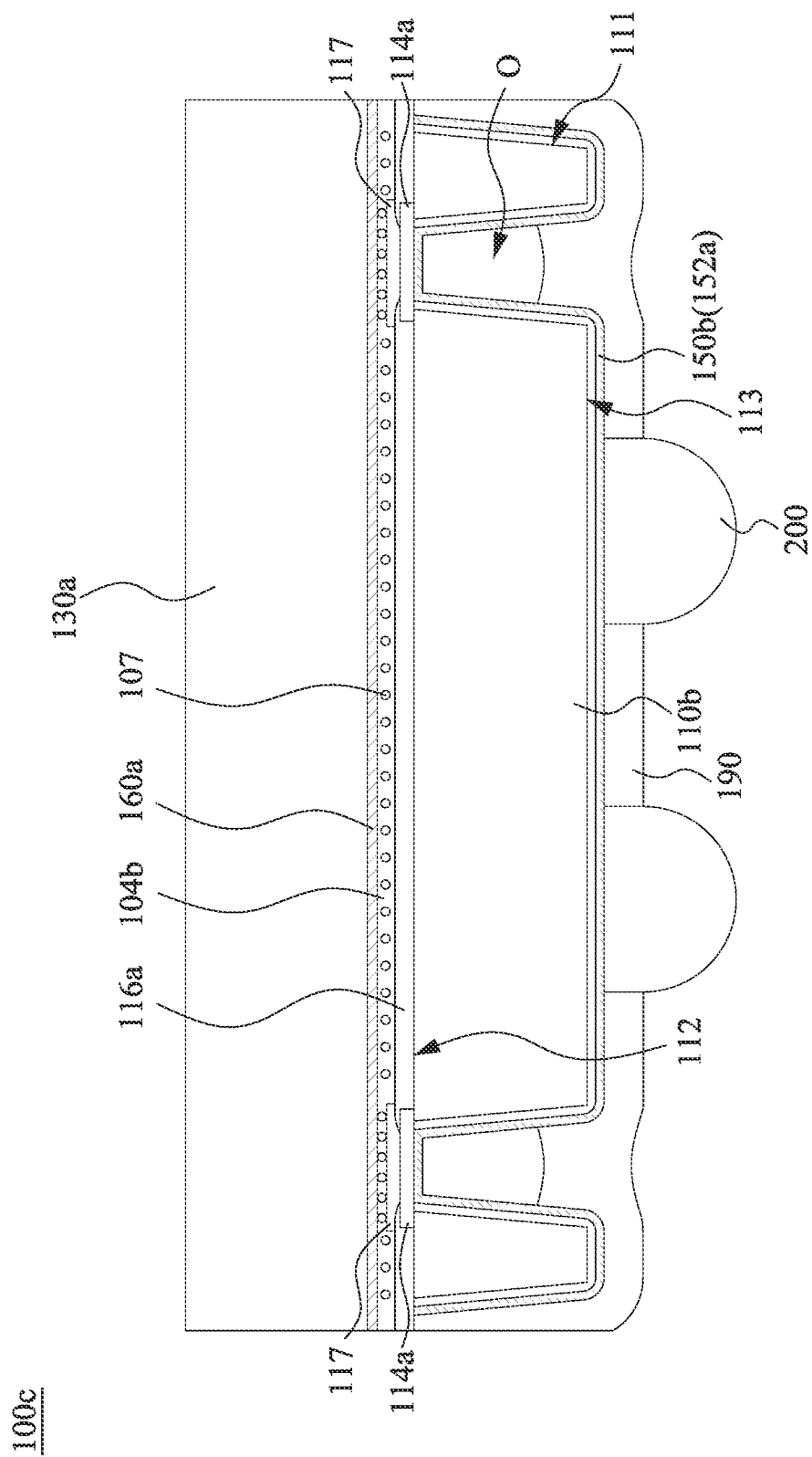
FIG. 8 is a cross-sectional view of the chip package taken along line 8-8 shown in FIG. 7.

FIG. 7 is a top view of a chip package 100c according to one embodiment of the present disclosure. FIG. 8 is a cross-sectional view of the chip package 100c taken along line 8-8 shown in FIG. 7. As shown in FIG. 7 and FIG. 8, the chip package 100c includes a first substrate 110b, a second substrate 130a, a conductive layer 160a, a bonding layer 104b, and a metal layer 150b. The first substrate 110b has a first through hole O and a first conductive pad 114a in the first through hole O. The second substrate 130a is over the first substrate 110b. The conductive layer 160a is between the first substrate 110b and the second substrate 130a. The bonding layer 104b is between the conductive layer 160a and the first substrate 110b. In addition, the bonding layer 104b includes conductive particles 107, such as silver particles. Hence, the bonding layer 104b can be electrically connected to the conductive layer 160a and the first conductive pad 114a through a conductive pillar 117 on the first conductive pad 114a. The conductive pillar 117 has a top surface in contact with the bonding layer 104b. The metal layer 150b is in the first through hole O1, and is on the bottom surface 113 and the sidewall 111 of the first substrate 110b. The metal layer 150b is electrically connected to the first conductive pad 114a. As a result of such a configuration, the metal layer 150b is electrically connected to the conductive layer 160a through the first conductive pad 114a and the bonding layer 104b. In some embodiments, the metal layer 150b and the conductive layer 160a may be formed by performing physical vapor deposition (e.g., sputtering).

Figure 9:
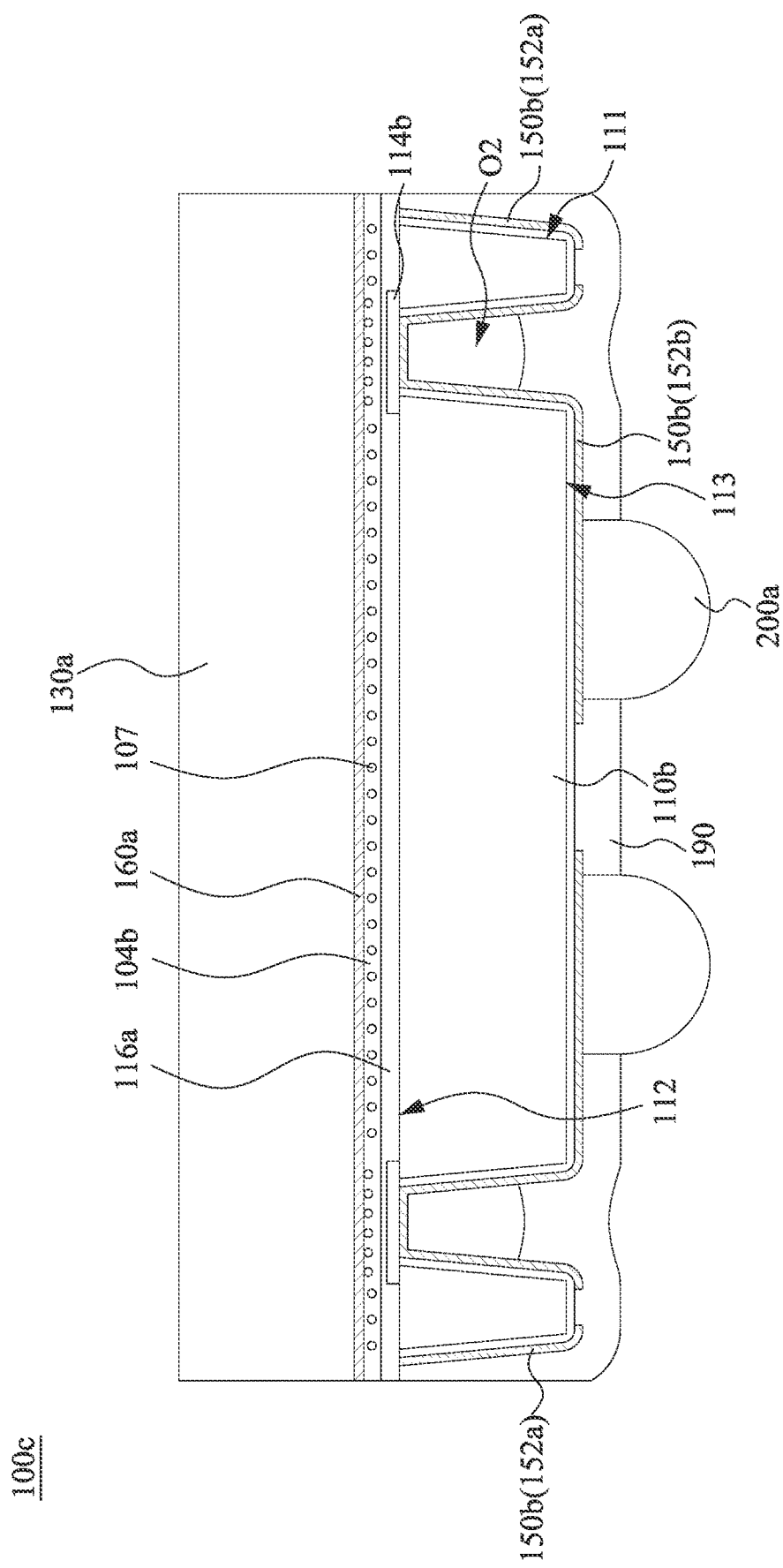
FIG. 9 is a cross-sectional view of the chip package taken along line 9-9 shown in FIG. 7.

FIG. 9 is a cross-sectional view of the chip package 100c taken along line 9-9 shown in FIG. 7. As shown in FIG. 7 to FIG. 9, the metal layer 150b includes a ground region 152a and a redistribution line 152b (RDL). The ground region 152a is electrically connected to the conductive layer 160a, while the redistribution line 152b is electrically isolated from the ground region 152a. In some embodiments, the ground region 152a of the metal layer 150b surrounds the redistribution line 152b of the metal layer 150b.

Moreover, the first substrate 110b has a second through hole O2 and a second conductive pad 114b in the second through hole O2, and the redistribution line 152b of the metal layer 150b is electrically connected to the second conductive pad 114b. However, no conductive pillar 117 of FIG. 8 is located on the second conductive pad 114b of FIG. 9, and thus the redistribution line 152b and the second conductive pad 114b are electrically isolated from the bonding layer 104b and the conductive layer 160a by the functional layer 116a.

Since the bonding layer 104b including the conductive particles 107 is between the conductive layer 160a and the first substrate 110b, a portion of the metal layer 150b (i.e., the ground region 152a) can be electrically connected to the conductive layer 160a through the first conductive pad 114a and the bonding layer 104b. In some embodiments, the ground region 152a of the metal layer 150b may be grounded, and thus the conductive layer 160a may serve as a shielding layer for electromagnetic interference (EMI). As a result, the chip package 100c does not need an additional metal can structure to prevent EMI. In other words, the miniaturization of the chip package 100c containing a shielding layer can be achieved.

In some embodiments, the top surface 112 of the first substrate 110b has the functional layer 116a, and the first and second conductive pads 114a and 114b are in the functional layer 116a. The first conductive pad 114a in the functional layer 116a is electrically connected to the bonding layer 104b through the conductive pillar 117 on the first conductive pad 114a. The entire second conductive pad 114b is embedded in the functional layer 116a to be spaced apart from the bonding layer 104b.

In addition, the first substrate 110b may be a semiconductor substrate made of silicon. The second substrate 130a may be a light-transmissive sheet made of glass. If the chip package 100 is used for microelectromechanical systems (MEMS), the conductive layer 160a may be a shielding layer made of copper, and the functional layer 116a of the first substrate 110b may be a MEMS structure. The conductive layer 160a (i.e., the shielding layer) can prevents the chip package 100c from electromagnetic interference (EMI).

If the chip package 100c is used for CMOS image sensor (CIS), the conductive layer 160a may be a shielding layer made of indium tin oxide (ITO) to let light pass through, and the functional layer 116a of the first substrate 110b may include an image sensor.

Furthermore, the chip package 100c further includes a first conductive structure 200 and a second conductive structure 200a. The first conductive structure 200 is on the bottom surface of the ground region 152a of the metal layer 150b. The second conductive structure 200a is on the bottom surface of the redistribution line 152b of the metal layer 150b. The first and second conductive structures 200 and 200a may be solder balls, and the present disclosure is not limited in this regard. The first and second conductive structures 200 and 200a may be electrically connected to a printed circuit board. The chip package further includes the passivation layer 190. The passivation layer 190 is below the metal layer 150b and surrounds the first and second conductive structures 200 and 200a.

It is to be noted that the connection relationships and materials of the aforementioned elements will not be described again in the following description.

Figure 10:
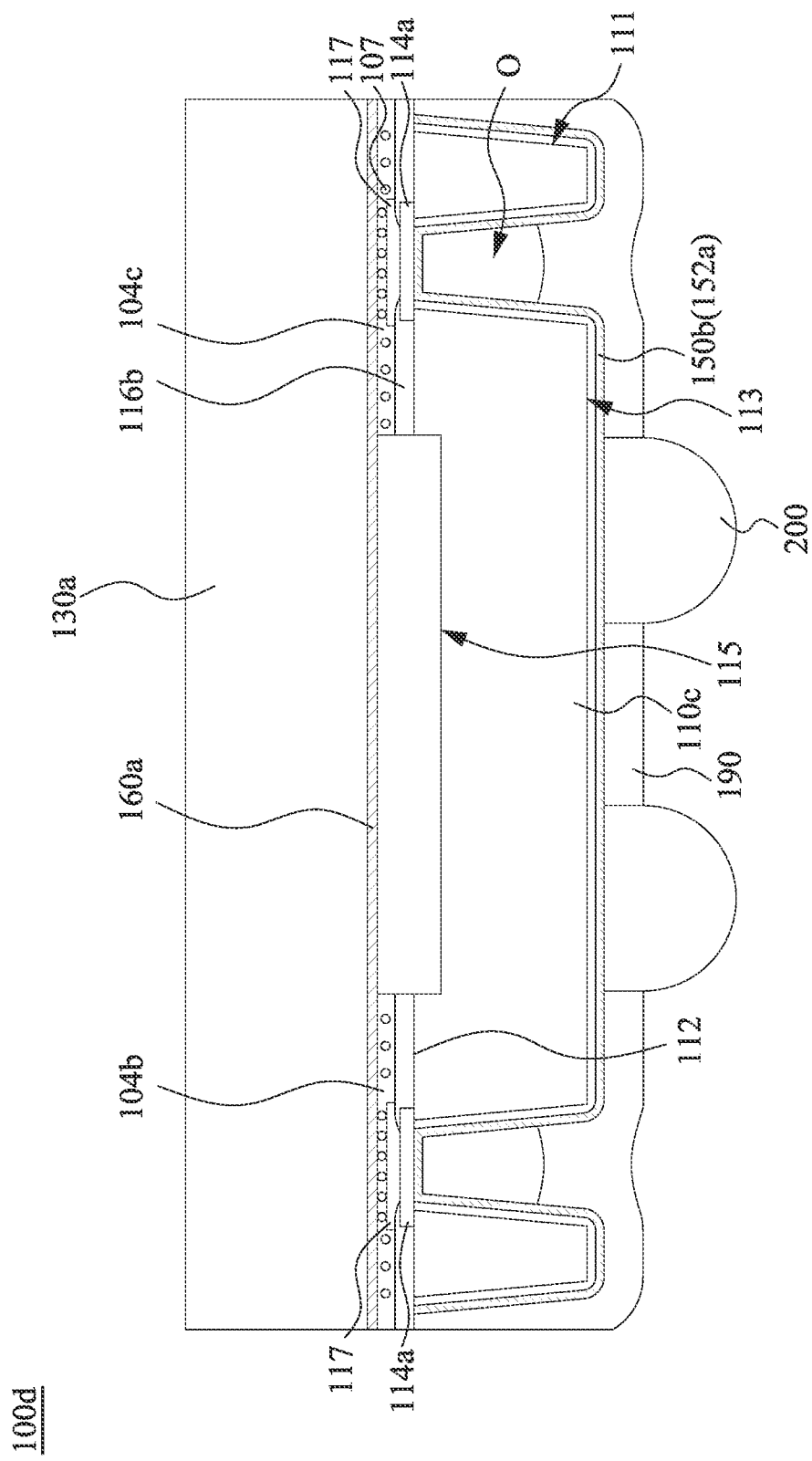
FIGS. 10 and 11 are two cross-sectional views of a chip package according to one embodiment of the present disclosure.
Figure 11:
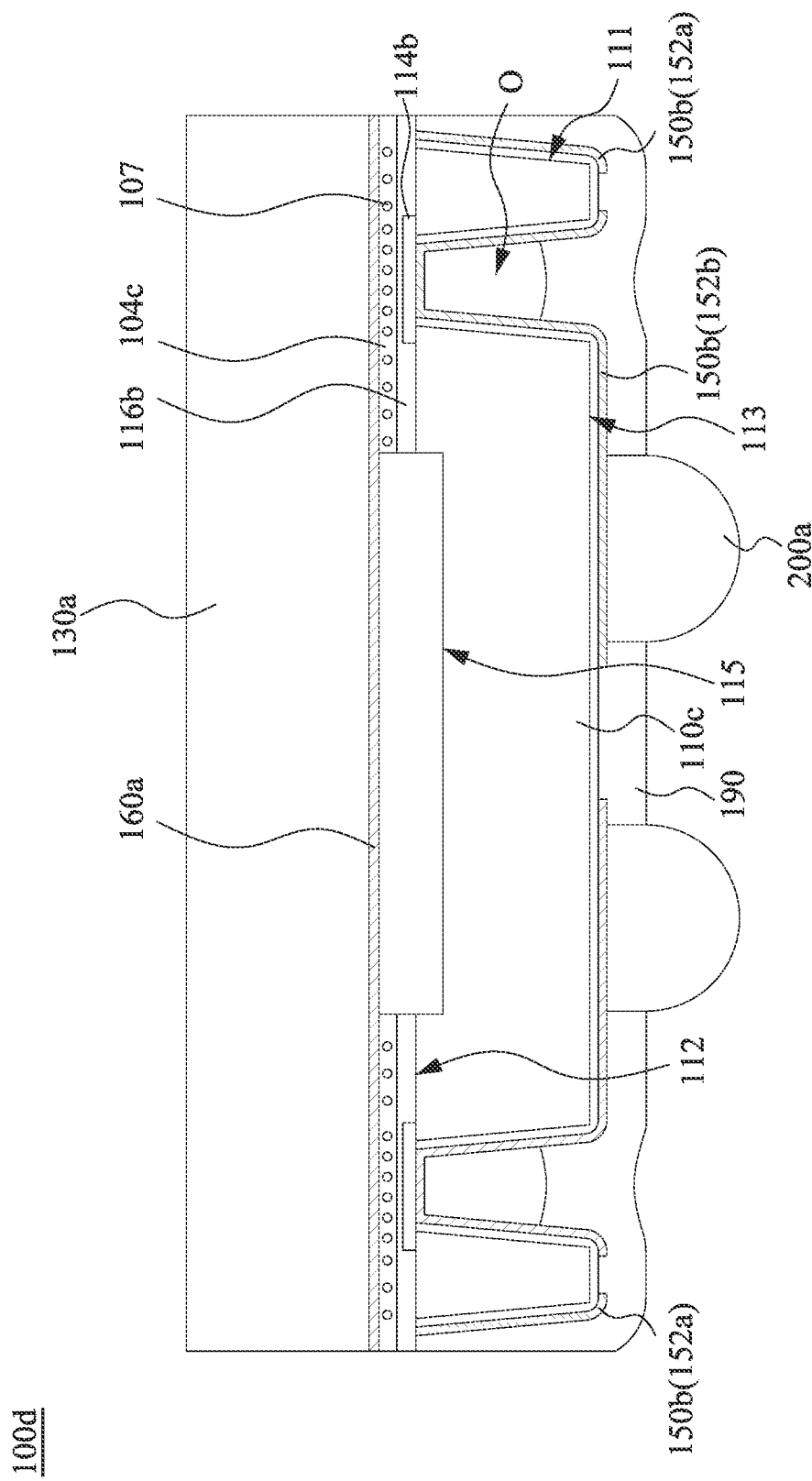

FIGS. 10 and 11 are two cross-sectional views of a chip package 100d according to one embodiment of the present disclosure. The cross-sectional position of FIG. 10 is the same as that of FIG. 8, and the cross-sectional position of FIG. 11 is the same as that of FIG. 9. As shown in FIG. 10 and FIG. 11, the chip package 100d includes a first substrate 110c, a second substrate 130, the conductive layer 160a, a metal layer 150b, and a bonding layer 104c. The difference between this embodiment and the embodiment shown in FIGS. 8 and 9 is that the first substrate 110c has the concave portion 115 below the conductive layer 160a. Moreover, the first substrate 110c has a functional layer 116b thereon. The functional layer 116b and the bonding layer 104c surround the concave portion 115, such that the concave portion 115 of the first substrate 110c directly face the conductive layer 160a.

Figure 12:
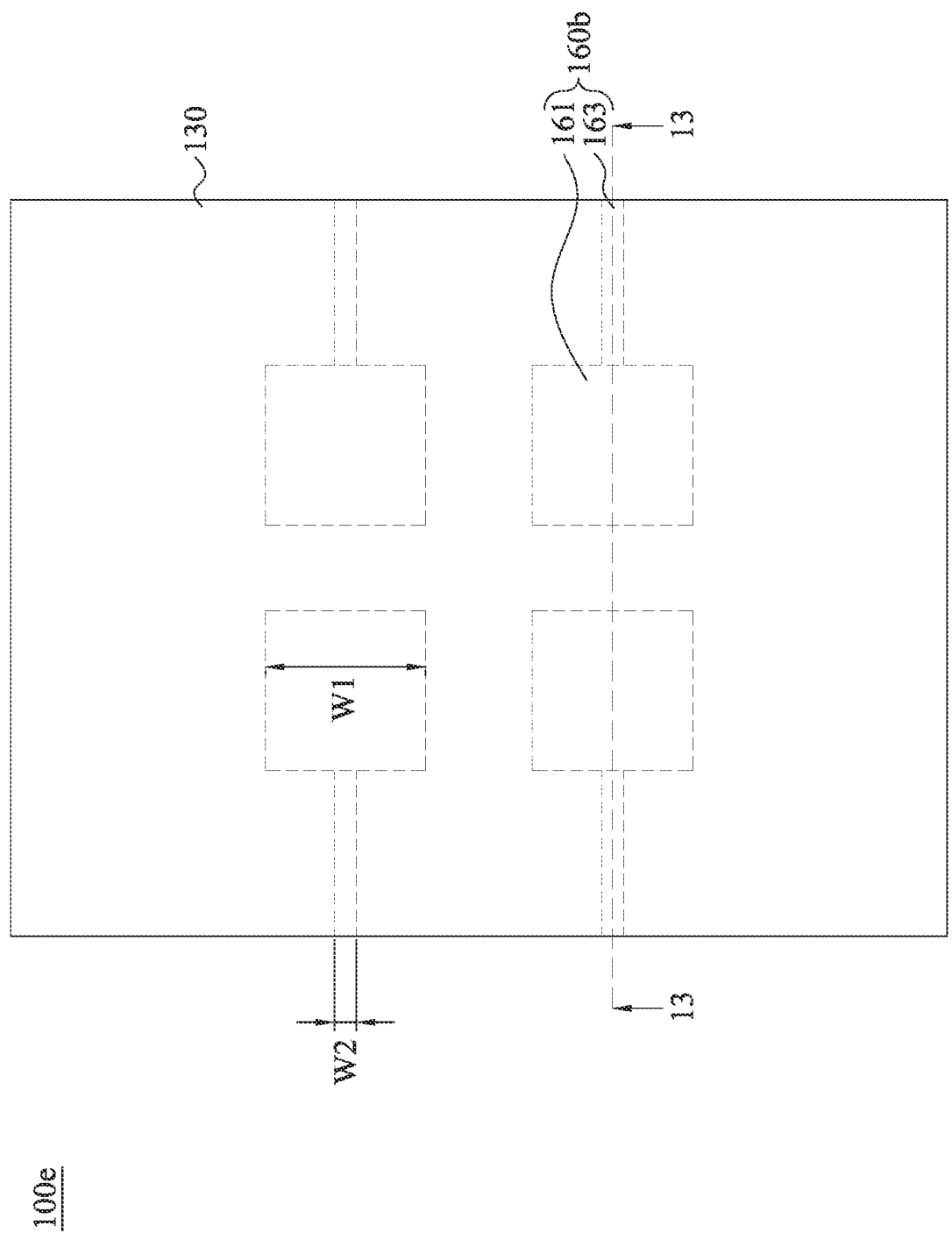
FIG. 12 is a top view of a chip package according to one embodiment of the present disclosure.
Figure 13:
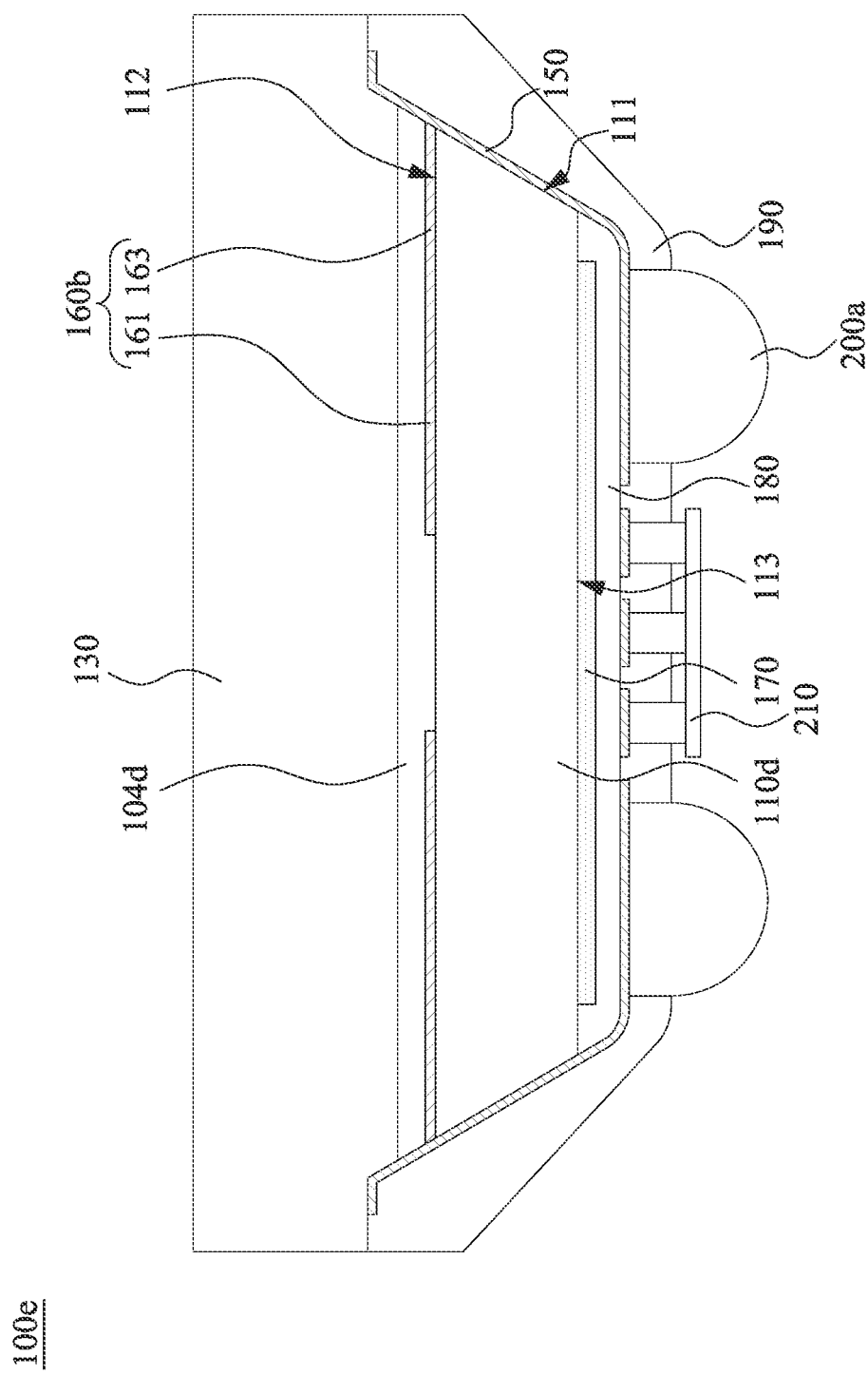
FIG. 13 is a cross-sectional view of the chip package taken along line 13-13 shown in FIG. 12.

FIG. 12 is a top view of a chip package 100e according to one embodiment of the present disclosure. FIG. 13 is a cross-sectional view of the chip package 100e taken along line 13-13 shown in FIG. 12. As a shown in FIGS. 12 and 13, the chip package 100e includes a first substrate 110d, a second substrate 130, a first conductive layer 160b, a metal layer 150, and a bonding layer 104d. The first substrate 110d has a bottom surface 113 and an inclined sidewall 111 adjoining the bottom surface 113, and an obtuse angle θ is between the bottom surface 113 and the inclined sidewall 111. The second substrate 130 is over the first substrate 110d and has a portion that laterally extends beyond the inclined sidewall 111 of the first substrate 110d. The first conductive layer 160b is between the first substrate 110d and the second substrate 130. The metal layer 150 is on said portion of the second substrate 130, on the bottom surface 113 and the inclined sidewall 111 of the first substrate 110d, and electrically connected to an end of the first conductive layer 160b. The bonding layer 104d covers the first conductive layer 160b.

The difference between this embodiment and the embodiment shown in FIGS. 2 and 3 is that the first conductive layer 160b is an antenna layer which has a patch portion 161 and a connection portion 163. The patch portion 161 has a width W1 greater than a width W2 of the connection portion 163. The connection portion 163 is between the patch portion 161 and the metal layer 150, and has a sidewall in contact with the metal layer 150. Furthermore, the first substrate 110d is a light-transmissive sheet made of glass without the functional layer 116 of FIGS. 2 and 3.

In this embodiment, the metal layer 150 is a redistribution line (RDL), and the first conductive layer 160b electrically connected to the redistribution line acts as an antenna.

In addition, the chip package 100e further includes a second conductive layer 170 between the bottom surface 113 of the first substrate 110d and the metal layer 150. Moreover, the chip package further includes a conductive structure 200a, a planarization layer 180, and a passivation layer 190. The conductive structure 200a is on a bottom surface of the metal layer 150. The conductive structure 200a may be a solder ball, and the present disclosure is not limited in this regard. The conductive structure 200a may be electrically connected to a printed circuit board. Moreover, the planarization layer 180 is between the bottom surface 113 of the first substrate 110d and the metal layer 150, and is between the inclined sidewall 111 of the first substrate 110d and the metal layer 150. The passivation layer 190 is below the metal layer 150 and the planarization layer 180, and surrounds the conductive structure 200a.

In some embodiments, the metal layer 150 and the first conductive layer 160b may be formed by performing physical vapor deposition (e.g., sputtering).

The chip package 100e further includes a third substrate 210 below the passivation layer 190 and electrically connected to the metal layer 150. In some embodiments, the third substrate 210 is a radio frequency (RF) chip. As a result of such a configuration, the second conductive layer 170 may serve as a shielding layer for electromagnetic interference (EMI).

Since the chip package 100e includes the first conductive layer 160b and the second conductive layer 170 therein, the chip package 100e does not need an additional metal can structure to prevent EMI, and does not need to connect an additional antenna outside the chip package 110e. In other words, the miniaturization of the chip package 100e containing a shielding layer (e.g., the second conductive layer 170) and an antenna (e.g., the first conductive layer 160b) can be achieved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing form the scope or spirit of the invention. In view of the foregoing, it is intended that the present invention covers modifications and variations of this invention provided they fall within the scope of the following claims.

What is claimed is:

1. A chip package, comprising:
    a first substrate having a bottom surface and an inclined sidewall adjoining the bottom surface, wherein an obtuse angle is between the bottom surface and the inclined sidewall;
    a second substrate over the first substrate and having a portion that laterally extends beyond the inclined sidewall of the first substrate;
    a first conductive layer between the first substrate and the second substrate; and
    a metal layer on said portion of the second substrate, on the bottom surface and the inclined sidewall of the first substrate, and electrically connected to an end of the first conductive layer, wherein the metal layer comprises a ground region and a redistribution line electrically isolated from the ground region.

2. The chip package of claim 1, wherein said end of the first conductive layer is in contact with the ground region of the metal layer, and the first conductive layer is spaced apart from the redistribution line of the metal layer.

3. The chip package of claim 1, wherein a top surface of the first substrate has a functional layer and a conductive pad in the functional layer, and the conductive pad has a sidewall in contact with the redistribution line of the metal layer.

4. The chip package of claim 3, wherein the conductive pad is spaced apart from the ground region of the metal layer.

5. The chip package of claim 3, wherein the functional layer laterally extends beyond the inclined sidewall of the first substrate, and the second substrate laterally extends beyond a sidewall of the functional layer.

6. The chip package of claim 1, further comprising:
a first conductive structure on a bottom surface of the ground region of the metal layer; and
a second conductive structure on a bottom surface of the redistribution line of the metal layer.

7. The chip package of claim 1, further comprising:
a bonding layer between the first substrate and second substrate.

8. The chip package of claim 1, wherein the first substrate has a concave portion below the first conductive layer.

9. The chip package of claim 1, further comprising:
a planarization layer between the bottom surface of the first substrate and the metal layer, and between the inclined sidewall of the first substrate and the metal layer; and
a passivation layer below the metal layer and the planarization layer.

10. The chip package of claim 1, further comprising:
a third substrate below the passivation layer and electrically connected to the metal layer.

11. The chip package of claim 1, further comprising:
a second conductive layer between the bottom surface of the first substrate and the metal layer.

12. The chip package of claim 11, wherein the first conductive layer is an antenna layer having a patch portion and a connection portion that is between the patch portion and the metal layer.

13. The chip package of claim 12, wherein the patch portion has a greater width than the connection portion.

* * * * *